(12) United States Patent
Ward et al.

(10) Patent No.: US 8,581,097 B2
(45) Date of Patent: Nov. 12, 2013

(54) TRANSFORMER ENCLOSURE HAVING A DROP-DOWN SILL GATE

(75) Inventors: Thomas Alan Ward, Jefferson City, MO (US); Virgil Bryan Zweifel, Linn, MO (US)

(73) Assignee: ABB Inc., Cary, NC (US)

( * ) Notice: Subject to any disclaimer, the term of this patent is extended or adjusted under 35 U.S.C. 154(b) by 122 days.

(21) Appl. No.: 13/362,471

(22) Filed: Jan. 31, 2012

(65) Prior Publication Data

US 2013/0194774 A1    Aug. 1, 2013

(51) Int. Cl.
*H02G 3/14* (2006.01)

(52) U.S. Cl.
USPC ............... 174/50; 336/65; 312/326; 52/515; 49/501

(58) Field of Classification Search
USPC ....... 174/50; 439/292; 336/65; 312/100, 326, 312/328, 327, 223.1; 52/515, 516; 49/501
See application file for complete search history.

(56) References Cited

U.S. PATENT DOCUMENTS

| 4,533,786 | A |   | 8/1985  | Borgmeyer et al. |
|-----------|---|---|---------|------------------|
| 4,556,758 | A |   | 12/1985 | Warden           |
| 5,573,319 | A |   | 11/1996 | Dirk             |
| 5,783,775 | A | * | 7/1998  | Marusinec ............... 174/50 |
| 5,889,231 | A |   | 3/1999  | Marusinec et al. |
| 6,066,802 | A |   | 5/2000  | Reinke et al.    |
| 6,140,572 | A | * | 10/2000 | Book ............... 174/17 CT |

* cited by examiner

*Primary Examiner* — Dhirubhai R Patel
(74) *Attorney, Agent, or Firm* — Melissa J. Szczepanik

(57) ABSTRACT

A transformer enclosure has a hood and sill attached to a tank. The hood is retractable upon hinges connected to the top face of the tank. The sill is attached to the front face of the tank near the base and has a gate that drops down to an expanded position. When the enclosure is in a closed position, the hood and sill meet with the sill gate fully retracted along a tamperproof interface. A tamperproof interface is formed at the side of the enclosure by a flange on the side panels of the sill and a baffle on the bottom edges of the hood. A tamperproof interface is formed at the front of the enclosure by a bend and lip formed in the front panel of the hood in cooperation with a recessed portion formed in the gate.

6 Claims, 4 Drawing Sheets

TRANSFORMER ENCLOSURE HAVING A DROP-DOWN SILL GATE

FIELD OF INVENTION

The present application is directed to an enclosure for a padmounted transformer.

BACKGROUND

Distribution transformers are used throughout the power network to step down high voltage to a lower voltage for consumer and industrial use. Distribution transformers are typically above ground and have connections to the network below ground. Above-ground transformer installations located in or near residential areas, require a transformer enclosure that prevents access by individuals other than utility service personnel.

Known enclosures have a tank, hood, and sill formed of metal. The tank houses the transformer core, coil windings, and dielectric fluid (if present). The hood protects the high and low voltage bushings and terminals. The hood interfaces with a sill that is bolted or otherwise rigidly attached to the tank and/or padmount. The hood and sill are typically secured using reinforced metal at the interface between the hood and sill in addition to a locking mechanism on the front face of the enclosure.

Often times, utility personnel need to access the terminals and electrical connections inside the enclosure but experience difficulty in gaining access to the terminals and electrical connections due to the location of the sill. The electrical connections rising up from the ground are stiff and difficult to manipulate and connect to the bushings and terminals of the transformer.

SUMMARY

A transformer enclosure is comprised of a tank, hood and sill. The tank has top, bottom, front, rear and side faces. The hood has front and side panels. The front and side panels have a bottom edge upon which a lip extends. The front panel has an inner wall having a bend formed therein. The side panels have baffles disposed thereon. The sill has front and side members. The side members of the sill have a flange that interfaces with the baffles of the hood. The front member of the sill has a gate. The gate has a rim to interface with the lip and bend formed in the front panel of the hood. The gate is expandable from a closed position and retractable from an open position upon the front member of the sill.

BRIEF DESCRIPTION OF THE DRAWINGS

In the accompanying drawings, structural embodiments are illustrated that, together with the detailed description provided below, describe exemplary embodiments of a transformer enclosure having a drop-down sill gate. One of ordinary skill in the art will appreciate that a component may be designed as multiple components or that multiple components may be designed as a single component.

Further, in the accompanying drawings and description that follow, like parts are indicated throughout the drawings and written description with the same reference numerals, respectively. The figures are not drawn to scale and the proportions of certain parts have been exaggerated for convenience of illustration.

DETAILED DESCRIPTION

Figure 1:
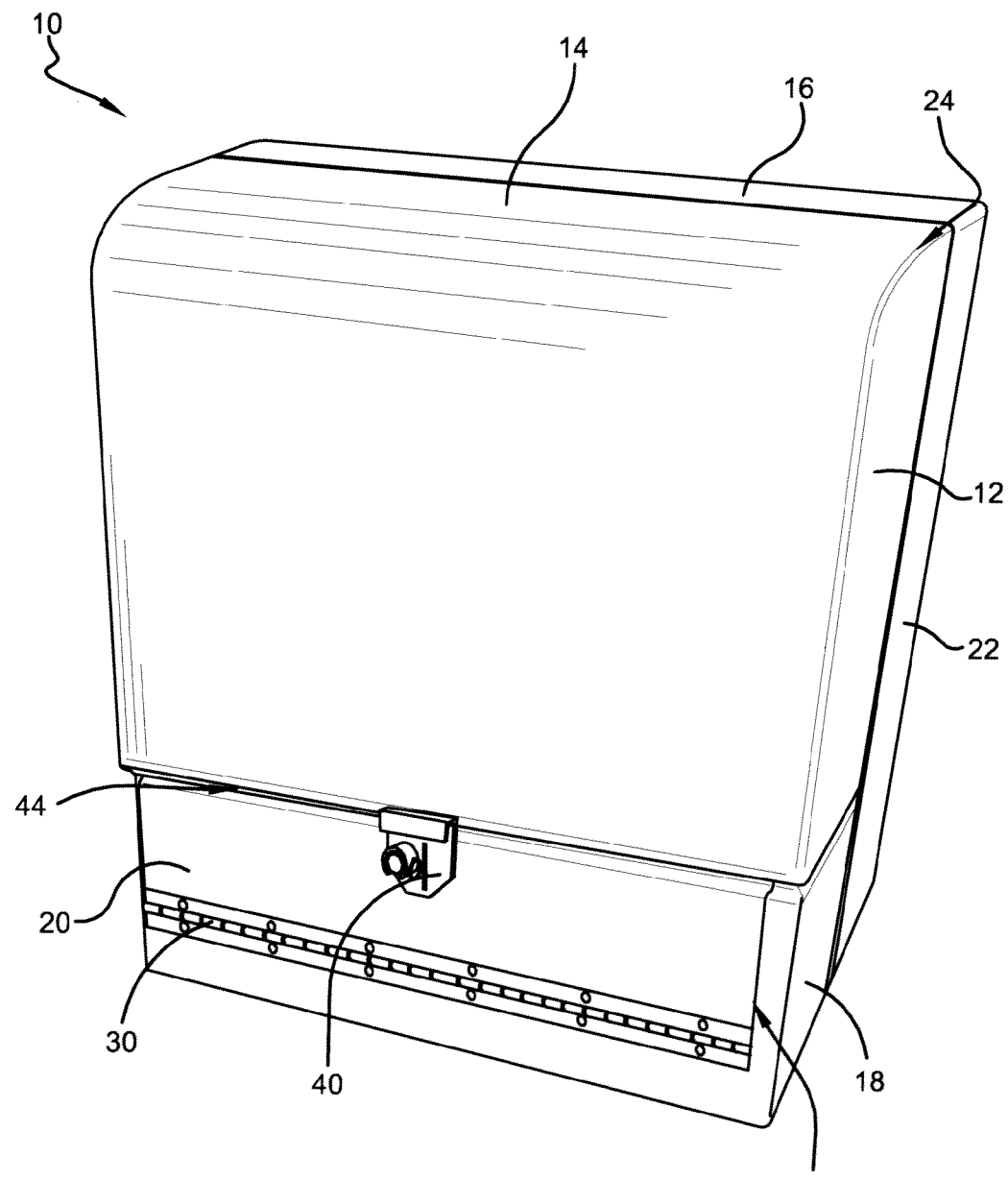
FIG. 1 is perspective view of a transformer enclosure having a hood, a sill, and a gate of the sill embodied in accordance with the present invention.

Referring to FIG. 1, an enclosure 10 for a padmount distribution transformer is shown in a closed position. The enclosure 10 is formed from a metal and has a hood 24 and a sill 18 that are attached to a transformer tank 22. The tank 22 has a front face, rear face, top face, bottom face, and side faces. The hood 24 is attached to a top face of the tank by hinges 56 shown in FIG. 2 and the sill 18 is bolted, welded, or otherwise attached to the front face of the tank 22 near the base of the tank 22. The exemplary enclosure 10 houses a single-phase transformer, however, it should be understood that a polyphase transformer may instead be housed by the enclosure 10.

The hood 24 has side and front panels 12, 14. The front panel 14 is contoured at a top edge. The side panels 12 are also curved to fit contours of the front panel of the hood 24 to render the hood 24 free of sharp edges. The side panels 12 are welded or bolted to the front panel 14. The hood 24 and the sill 18 meet at a hood-sill interface 44. The hood-sill interface 44 is tamperproof due to the cooperating features of the hood and sill 24, 18 which will be described in detail below. A locking mechanism 40 is used to further secure the enclosure 10.

Figure 2:
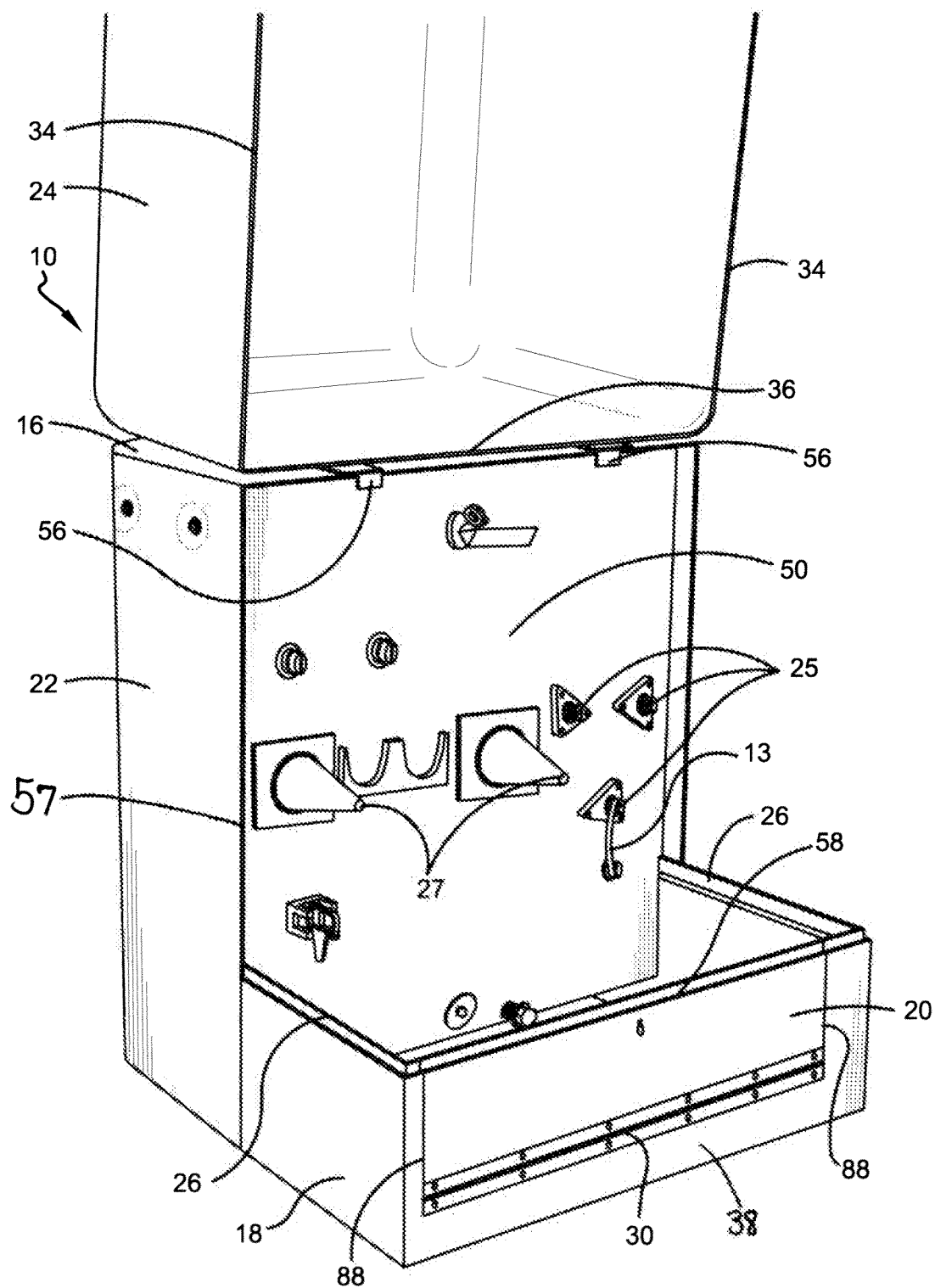
FIG. 2 shows the transformer enclosure with the hood retracted.

Referring now to FIG. 2, the hood 24 is shown in a retracted position and a gate 20 of the sill 18 is closed. The hood 24 retracts from a closed position on hinges 56 that allow a top portion of the hood 24 to contact the top face of the tank 22 when fully open. The tank 22 has a front face 50 upon which are located high and low voltage terminals 27, 25. A low voltage terminal 25 is shown in connection with ground using a metal strap 13 formed of a material such as copper. The high and low voltage terminals 27, 25 are accessed through the hood 24.

The side panels 12 of the hood 24 have Z-channel members (not shown) that interface with protrusions 57 along the side edges of the front face of the tank 22. The Z-channel members of the hood 24 are Z-shaped with rounded bends and the protrusions 57 extend forward from the front face of the tank 22. Each protrusion 57 has an arcuate edge on one end that interfaces with a bend of the corresponding Z-channel member.

The hood 24 has a lip 34 that extends along the length of a bottom edge of the side and front panels 12, 14. The lip 34 extends inwardly from the bottom edge of the side and front panels 12, 14 to create a seal along the hood-sill interface 44 when the hood 24 and gate 20 are both in closed positions.

The sill 18 is generally U-shaped and extends from about ten centimeters to about 30 centimeters from the ground, concrete pad or other suitable mounting surface which are well known to those having ordinary skill in the art and thus, are not shown in the drawing figures. The sill 18 is formed from front and side members 38, 60. The electrical connections that rise from the ground are located behind the sill 18. The electrical connections are stiff, making work behind the sill 18 and connections to the high and low voltage terminals difficult. Therefore, in accordance with the present invention, the front member 38 has a gate 20 that drops down when extended. The gate 20 is attached to the sill 18 by a lengthwise hinge 30 that is disposed across a substantial portion of the length of the front member 38 of the sill 18. The lengthwise hinge 30 allows the gate 20 to fold down or drop down more than 90 degrees from a closed position. The gate 20, when fully retracted, contacts the ground or mounting surface of the enclosure 10. The gate 20 allows for easy access to the electrical connections and cables that rise from the ground.

Figure 3:
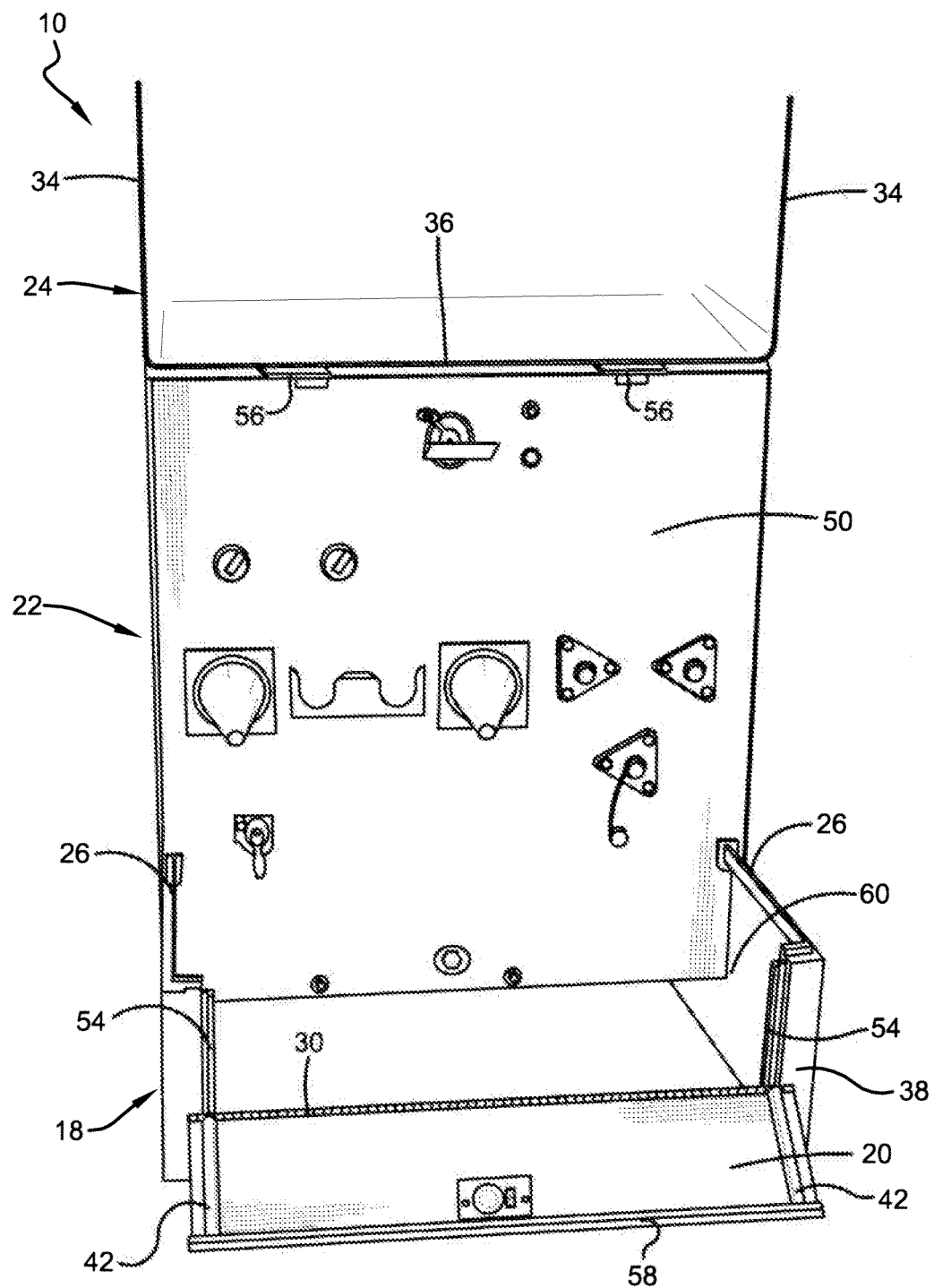
FIG. 3 shows the transformer enclosure with the hood retracted and the gate in a drop-down position.

Referring now to FIG. 3, the enclosure 10 is shown with the gate 20 fully expanded or dropped down. The gate 20 comprises a large portion of the front member 38 of the sill 18. The gate 20 has a top edge and two side edges. The top edge of the gate 20 has a rim 58 that protrudes from the surface of the gate 20 and extends between the two side edges. The rim 58 has a curved side that faces the inside of the enclosure 10 and a recessed side that faces the outside of the enclosure 10. End portions of the curved side of the rim 58 fit into grooves 62 shown in FIG. 5 that are disposed on the sill 18. The side edges of the gate 20 have metal bars 42 welded thereon. The metal bars 42 extend at least an inch from the inside surface of the gate 20 and fit into channel members 54 in the sill 18 when the gate 20 is in a closed position.

Figure 4:
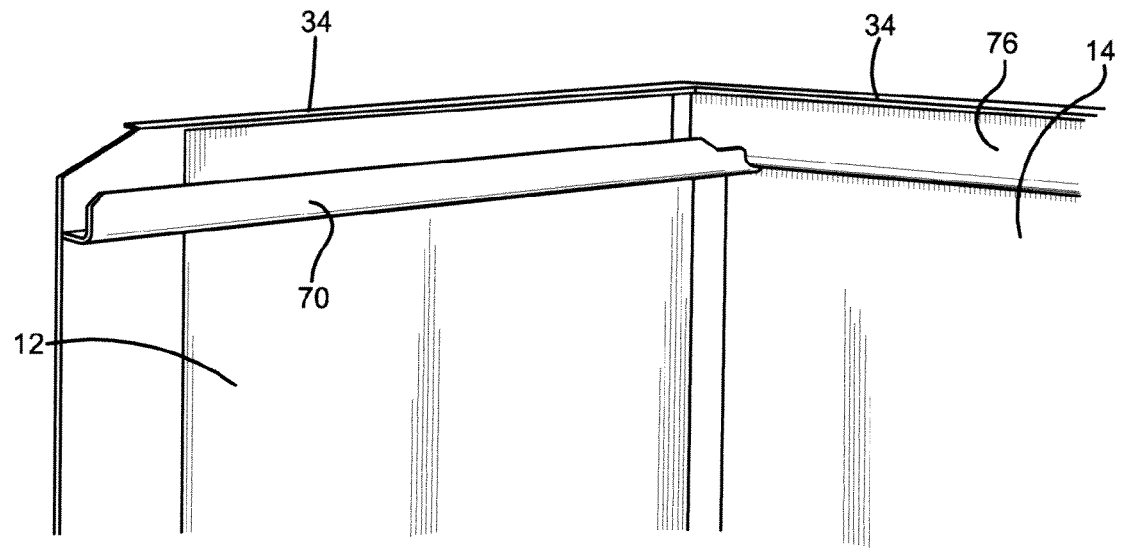
FIG. 4 shows the inside of the retracted hood having a lip extending across a bottom edge of the front and side panels, a baffle disposed near the edge of each side panel and a bend formed in the edge of the front panel.

With reference now to FIG. 4, the hood 24 is in an open position and the bottom edges of the front and side panels 14, 12 are shown. The lip 34 extends across the bottom edges of the front and side panels 14, 12. A baffle 70 is attached to the inside wall of the side panels 12. The baffle 70 cooperates with the lip 34, to surround an inside edge and an outside edge of the flange 26 of the sill 18, respectively, when the hood 24 and gate 20 are in closed positions. The baffle 70 and the lip 34 render the sides of the enclosure along the hood-sill interface 44 tamperproof, for example, against the insertion of foreign objects. The design of the hood-sill interface 44 also protects the transformer from moisture.

The front panel 14 of the hood 24 has a bend 76 that in cooperation with the recessed side of the rim 58 renders the front of the enclosure 10 tamperproof when the hood 24 and gate 20 are closed. The front side of the enclosure 10 along the hood-sill interface 44 is also protected from moisture in the aforementioned cooperative arrangement.

Figure 5:
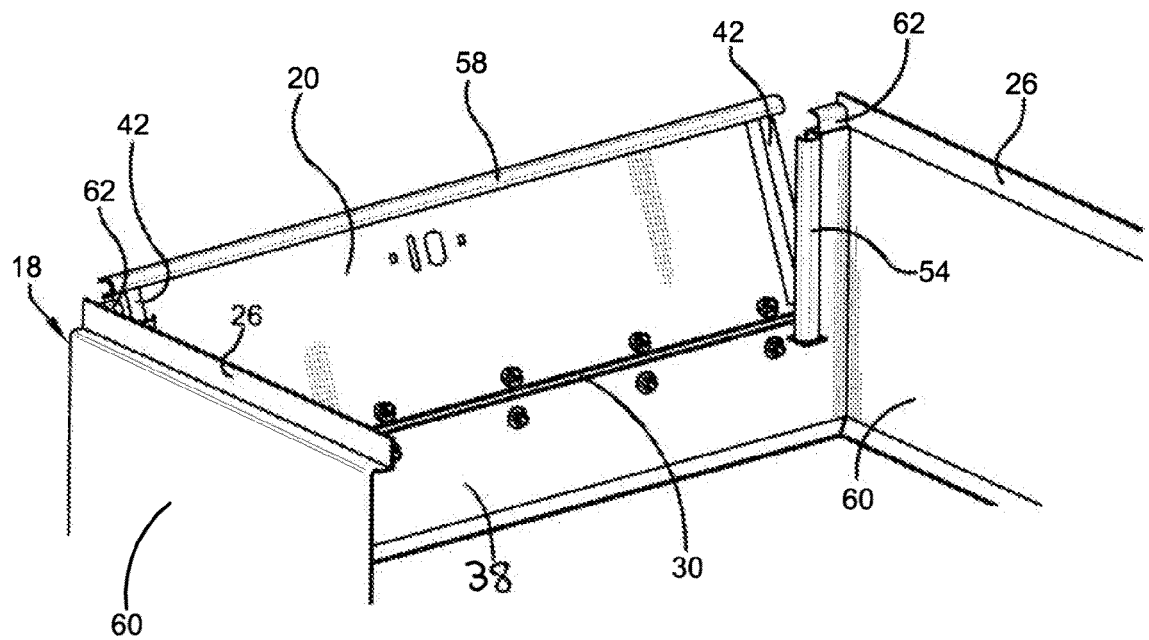
FIG. 5 shows a perspective view of the gate and sill interface wherein the gate is partially extended.

With reference now to FIG. 5, the enclosure 10 is depicted with the gate 20 of the sill 18 partially expanded. The metal bars 42 each fit into a corresponding one of the channel members 54 as previously described. As can be seen in FIG. 5, the rim 58 has opposing end portions that fit into grooves 62 disposed in the sill 18. A tamperproof sill-gate interface 88 is formed when the rim 58 is engaged with the lip 34 and bend 76 of the hood 24 and grooves 62 of the sill 18 and the metal bars 42 are engaged with the channel members 54 of the sill 18.

While the present application illustrates various embodiments of a transformer enclosure having a drop-down sill gate 20, and while these embodiments have been described in some detail, it is not the intention of the applicant to restrict or in any way limit the scope of the appended claims to such detail. Additional advantages and modifications will readily appear to those skilled in the art. Therefore, the invention, in its broader aspects, is not limited to the specific details, the representative embodiments, and illustrative examples shown and described. Accordingly, departures may be made from such details without departing from the spirit or scope of the applicant's general inventive concept.

What is claimed is:

1. A transformer enclosure comprised of: a tank having a base, a transformer core and coils;
   a hood attached to a top face of said tank, said hood having a front panel and side panels, said front panel and side panels each having a bottom edge along which a lip extends, said lip extending inwardly from said bottom edge, and each of said side panels having a baffle attached to an inside wall of said side panels; and
   a sill attached proximate to the base of said tank, said sill having a front member and side members, each of said side members having a flange to interface with a corresponding one of said hood side panel baffles, said sill further comprising a gate, said gate having a rim to interface with said lip, and said gate is opened and closed by a hinge attached to said front member.

2. The transformer enclosure of claim 1 wherein said sill gate is extendable from a closed position to an open position when said hood is retracted.

3. The transformer enclosure of claim 1 wherein said sill gate is retractable from an open position to a closed position when said hood is retracted.

4. The transformer enclosure of claim 1 wherein when each of said side panel baffles are engaged with corresponding ones of said sill flanges and said gate rim is engaged with said hood lip, a tamperproof interface is formed at a hood-sill interface.

5. The transformer enclosure of claim 1 wherein when said gate is in a closed position, said gate rim is engaged with grooves formed in said sill and metal bars disposed on side edges of said gate are engaged with channel members of said sill, a tamperproof interface is formed at a sill-gate interface.

6. The transformer enclosure of claim 1 wherein said gate is extendable at least 90 degrees from a closed position to an open position.

\* \* \* \* \*